United States Patent
Yasui

(10) Patent No.: US 7,365,794 B2
(45) Date of Patent: Apr. 29, 2008

(54) BUILT-IN CAMERA MODULE SUITABLE FOR CAMERAS BUILT INTO MOBILE COMMUNICATION TERMINAL AND MOBILE COMMUNICATION TERMINAL USING THE CAMERA MODULE

(75) Inventor: Kenichiro Yasui, Tokyo (JP)

(73) Assignee: NEC Corporation, Tokyo (JP)

( * ) Notice: Subject to any disclaimer, the term of this patent is extended or adjusted under 35 U.S.C. 154(b) by 822 days.

(21) Appl. No.: 10/619,257

(22) Filed: Jul. 14, 2003

(65) Prior Publication Data
US 2004/0021792 A1    Feb. 5, 2004

(30) Foreign Application Priority Data
Jul. 31, 2002    (JP) .............................. 2002-222293

(51) Int. Cl.
*H04N 5/225*    (2006.01)
(52) U.S. Cl. .................. 348/374; 348/211.11; 348/262
(58) Field of Classification Search ........... 348/211.11, 348/262, 48, 153, 159, 373; 455/90.1, 66.99
See application file for complete search history.

(56) References Cited

U.S. PATENT DOCUMENTS

| | | | |
|---|---|---|---|
| 6,160,967 A * | 12/2000 | Mizobuchi | 396/542 |
| 6,727,939 B1 * | 4/2004 | Stekelenburg | 348/158 |
| 2003/0146285 A1 * | 8/2003 | Moore et al. | 235/462.48 |
| 2004/0212709 A1 * | 10/2004 | Lee et al. | 348/333.01 |
| 2005/0237424 A1 * | 10/2005 | Weekamp et al. | 348/373 |

FOREIGN PATENT DOCUMENTS

| JP | H10-179516 | 7/1998 |
|---|---|---|
| JP | H11-261178 | 9/1999 |

* cited by examiner

*Primary Examiner*—Lin Ye
*Assistant Examiner*—Gevell Selby
(74) *Attorney, Agent, or Firm*—Scully, Scott, Murphy & Presser, P.C.

(57) ABSTRACT

A camera module according to the invention comprises one flexible substrate, first and second camera units mounted on the same face of this flexible substrate, and bent parts so set in prescribed positions of the flexible substrate that the directions of the fields of view of the first and second camera units be reverse to each other. As these features can provide a configuration in which the directions of the fields of view of the two camera units are reverse (180 degrees) to each other, there is no need to provide an FPC, which is a printed circuit board for control use, for each camera but one common FPC can suffice, resulting in an advantage of simpler structure.

12 Claims, 9 Drawing Sheets

DEVELOPMENT
OF CAMERA MODULE

SHAPE AFTER
BENDING

ASSEMBLING OF CAMERA MODULE INTO FIXED FRAME

DEVELOPMENT OF
CAMERA MODULE

SHAPE AFTER
BENDING

ASSEMBLING OF CAMERA
MODULE INTO FIXED FRAME

BUILT-IN CAMERA MODULE SUITABLE FOR CAMERAS BUILT INTO MOBILE COMMUNICATION TERMINAL AND MOBILE COMMUNICATION TERMINAL USING THE CAMERA MODULE

BACKGROUND OF THE INVENTION

1. Field of the Invention

The present invention relates to a camera module for mobile communication terminal, and more particularly to a camera module suitable for use in cameras built into mobile telephones, the personal handy phone system (PHS) and mobile information terminals and a mobile communication terminal.

2. Description of the Related Art

Mobile telephones, one of the latest categories of mobile communication terminals, are increasingly diversified in function, and many models with built-in cameras are now available in the market. Along with that, users' requirement for multi-directional shooting is increasing. For this requirement, a mobile telephone with a single variable-direction camera has been proposed.

As disclosed in the Japanese Patent Application Laid-open No. 2001-136254 and the Japanese Patent Application Laid-open No. 2000-253118, for instance, there are proposed structures in which a single camera is provided rotatably with a rotating mechanism, so that the camera can be flexibly moved as the user desires.

However, a structure to make the camera rotatable requires not only a complex rotating mechanism, such as a universal joint, but also wiring inside this rotating mechanism for electrically connecting the camera and circuits within the mobile telephone, resulting in a correspondingly complex wiring structure.

It is also conceivable to build a plurality of cameras into the mobile telephone body, but this would entail an increase in two-dimensional and three-dimensional space for mounting the plurality of cameras, and moreover each camera would need a printed circuit board to accommodate electrical wiring and circuits for controlling it, which would prove to be another factor to increase the required mounting area and the complexity of internal mounting.

An object of the present invention, attempted in view of these problems involved in the prior art and with an eye to obviating the disadvantage of building in a plurality of cameras, is to provide a camera module that can eliminate the increase in mounting area and in the complexity of wiring and other aspects where two cameras are to be mounted and further can facilitate their mounting, and a mobile communication terminal using it.

SUMMARY OF THE INVENTION

A camera module according to the invention comprises one flexible printed circuit board (FPC), first and second camera units mounted on the same face of this FPC, and bent parts so set in prescribed positions of the flexible substrate that the directions of the fields of view of the first and second camera units be reverse to each other.

A camera module according to the invention comprises one FPC, and first and second camera units mounted on different faces of this FPC so that the directions of their fields of view be reverse to each other.

Either camera module may include bent parts so set in prescribed positions of the FPC that the lens face of the first camera unit and the rear face of the second camera unit be on substantially the same plane, and the rear face of the first camera unit and the lens face of the second camera unit be on substantially the same plane.

A mobile communication terminal according to the invention has, built into it, the camera module described above, and the first camera unit may be intended for short-range shots and the second camera unit, for long-range shots. The lens face of the first camera unit may be exposed on a front case constituting the body of the mobile communication terminal, and the lens face of the second camera unit, exposed on a rear cover constituting the body.

BRIEF DESCRIPTION OF THE DRAWINGS

The above and other objects, features and advantages of the present invention will become more apparent from the following detailed description when taken in conjunction with the accompanying drawings wherein.

DETAILED DESCRIPTION OF THE PREFERRED EMBODIMENTS

A first preferred embodiment of the present invention has a structure in which two camera units are mounted on the same face of one flexible printed circuit board (FPC). The camera unit includes camera device and lens. The FPC is bent in positions designated in advance so that the directions of the fields of view of the two camera units be reverse (180 degrees) to each other to constitute an integrated camera module over a single FPC. This integrated camera module is assembled into the fixed frame of the body of a mobile communication terminal to achieve space-efficient camera packaging.

In a second embodiment of the invention, two camera units are mounted on the two faces of a single FPC so that the directions of the fields of view of the two camera units be reverse (180 degrees) to each other, and this integrated camera module formed on a single FPC is assembled into the fixed frame of the body to achieve space-efficient camera packaging.

Figure 1:
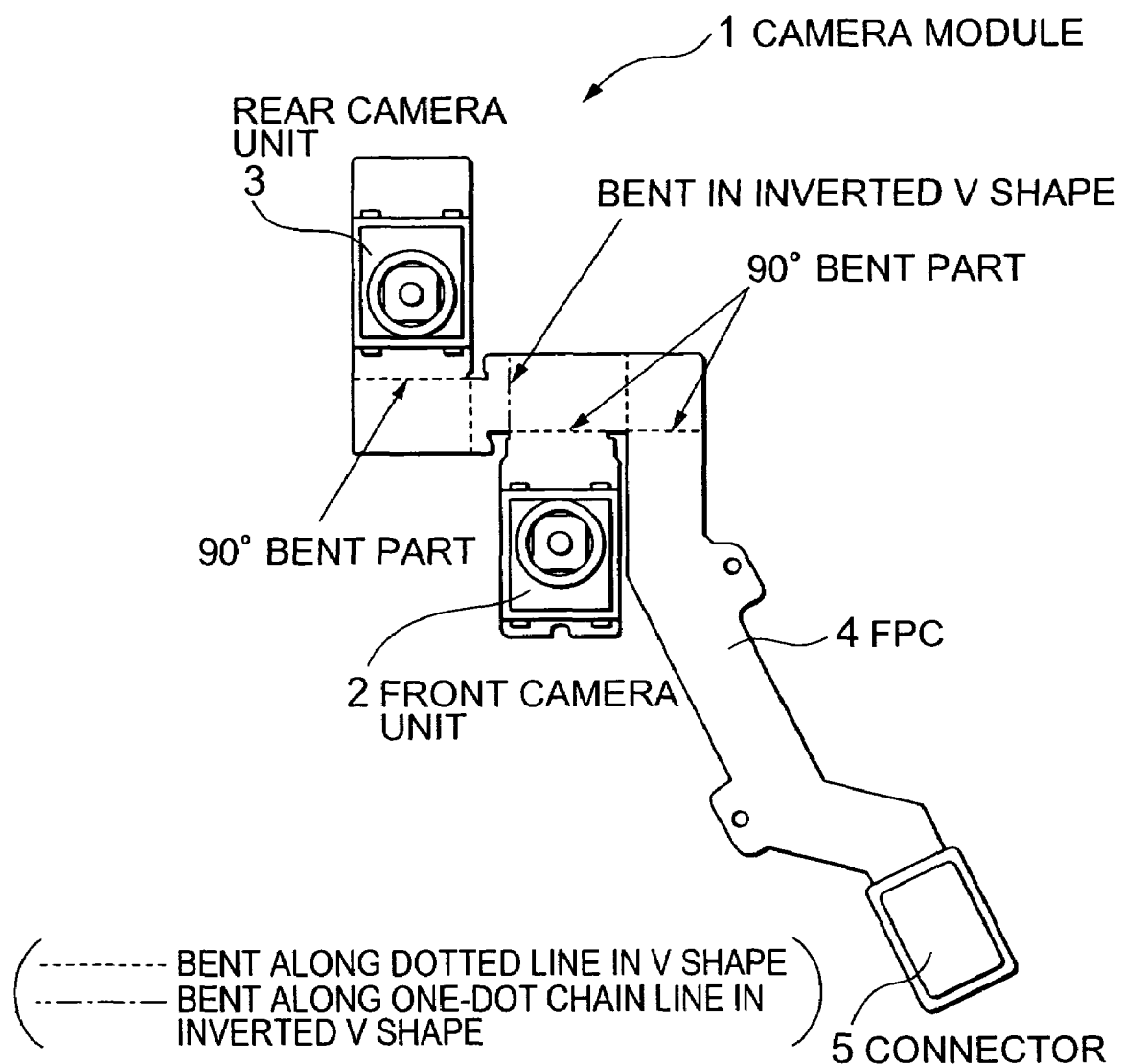
FIG. 1 shows a planar view of a camera module, which is a preferred embodiment of the invention.
Figure 2:
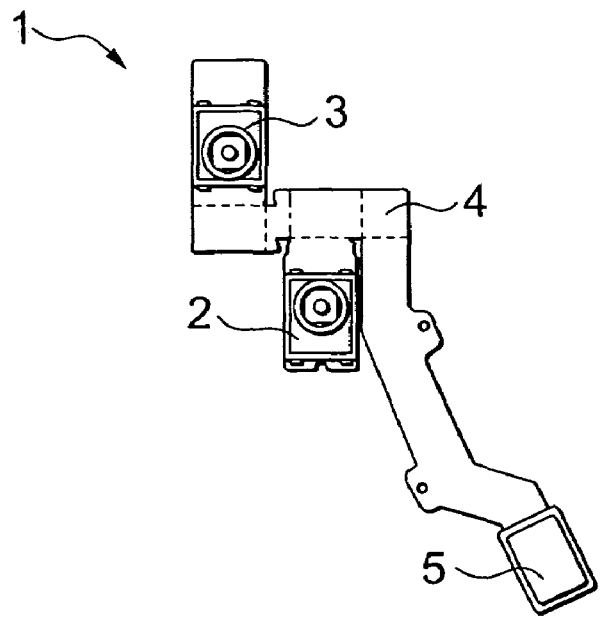
FIG. 2 is a first drawing showing the procedure of assembling the camera module of FIG. 1 into the fixed frame of the body of the mobile communication terminal.
Figure 3:
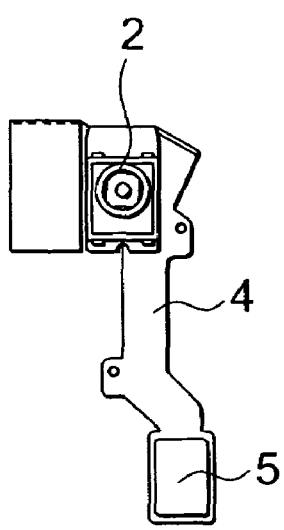
FIG. 3 is a second drawing showing the procedure of assembling the camera module of FIG. 1 into the fixed frame of the body of the mobile communication terminal.
Figure 4:
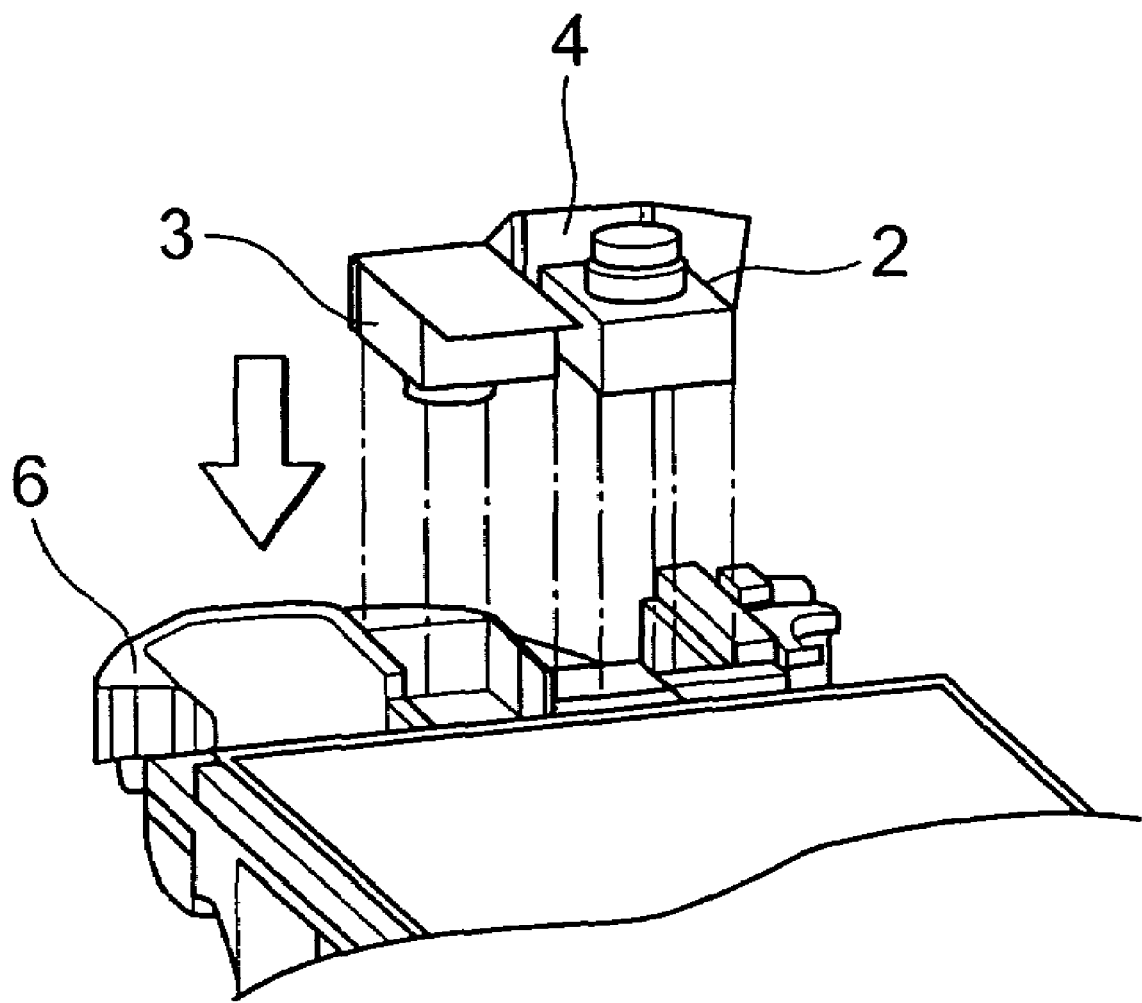
FIG. 4 is a third drawing showing the procedure of assembling the camera module of FIG. 1 into the fixed frame of the body of the mobile communication terminal.
Figure 5:
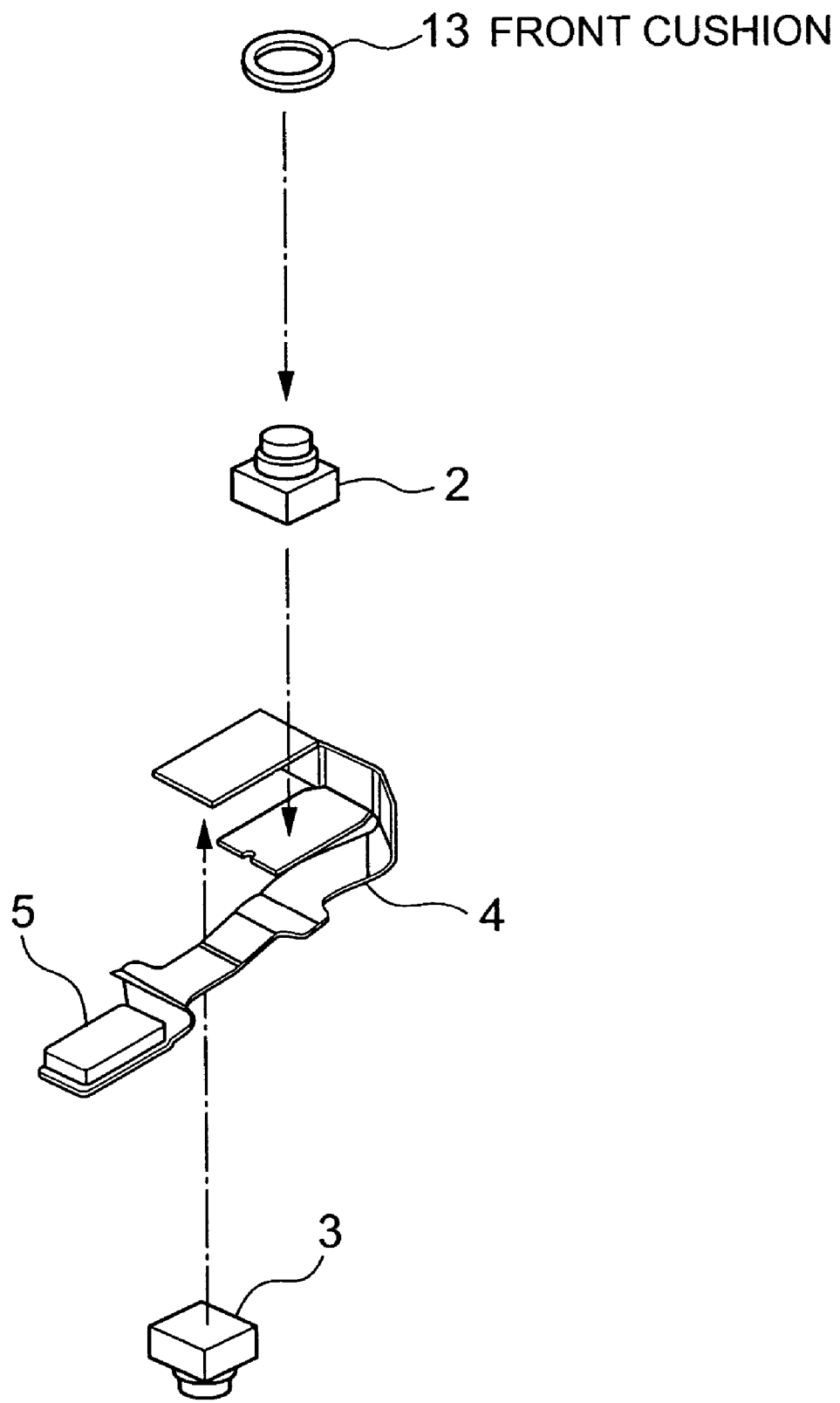
FIG. 5 shows an exploded perspective view of the camera module 1 of FIG. 1.

The preferred embodiments of the invention will be described in detail below with reference to the accompanying drawings. FIG. 1 shows a plan (development) of a camera module 1, which is the first preferred embodiment of the invention, and FIG. 2 through FIG. 4 illustrate the procedure of assembling the camera module of FIG. 1 into the fixed frame of the body of a mobile communication terminal. FIG. 5 shows an exploded perspective view of the camera module 1.

Referring to FIG. 1, there is provided one FPC 4, and two camera units, including a the front camera unit 2 and a rear camera unit 3, are mounted on prescribed parts of the same face of this FPC 4. Over this FPC 4 is printed electrical wiring (though not shown) for controlling the two camera units 2 and 3, which is connected to a receptor 8 (see FIG. 7) on the mobile communication terminal body side via a connector 5 provided at the tip of the FPC 4.

In FIG. 1, positions on the FPC 4 indicated by dotted lines and a one-dot chain line are to be bent to form a normal V shape and an inverted V shape, respectively. The dotted lines which are designated as "90° bent part" indicate that the parts should be bent in a 90-degree V shape. By bending the FPC 4 of this camera module 1 in normal or inverted V shapes according to the dotted lines and the one-dot chain line, respectively, the camera module of the structure shown in FIG. 3 and FIG. 5 can be obtained. Thus, as shown in FIG. 3, the field of view of the front camera unit 2 will be oriented towards the front face of the drawing, and that of the rear camera unit 3, towards the rear face of the drawing, so that the fields of view of the two units be reverse, or at 180 degrees, to each other.

Figure 6:
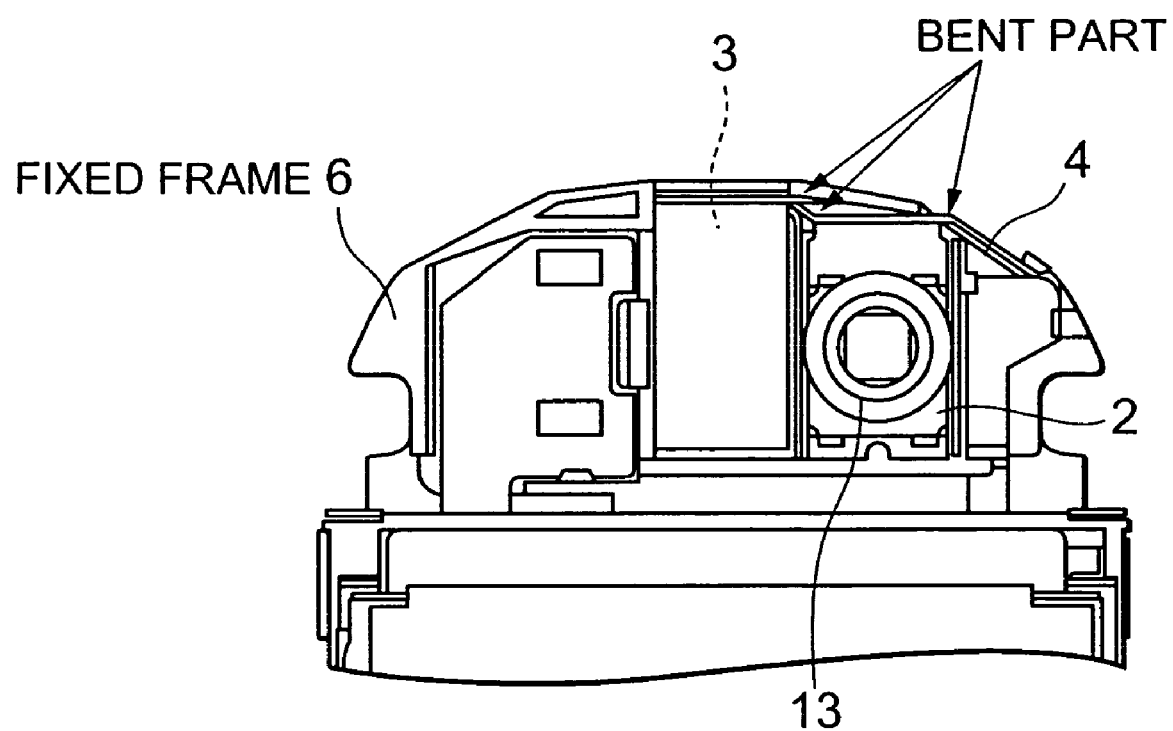
FIG. 6 shows a state of the camera module 1 of FIG. 1 being fitted to the fixed frame.

The camera module 1 of such a structure, as shown in FIG. 4, is fitted to a prescribed position of a fixed frame 6 within the body. FIG. 6 illustrates in detail the state of the camera module being fitted to the fixed frame 6. In FIG. 6, only the front camera unit 2 is visible, but not the rear camera unit 3. Incidentally in FIG. 5, reference numeral 13 denotes a front cushion, which is intended to damp the impact load on the front camera unit 2.

Figure 7:
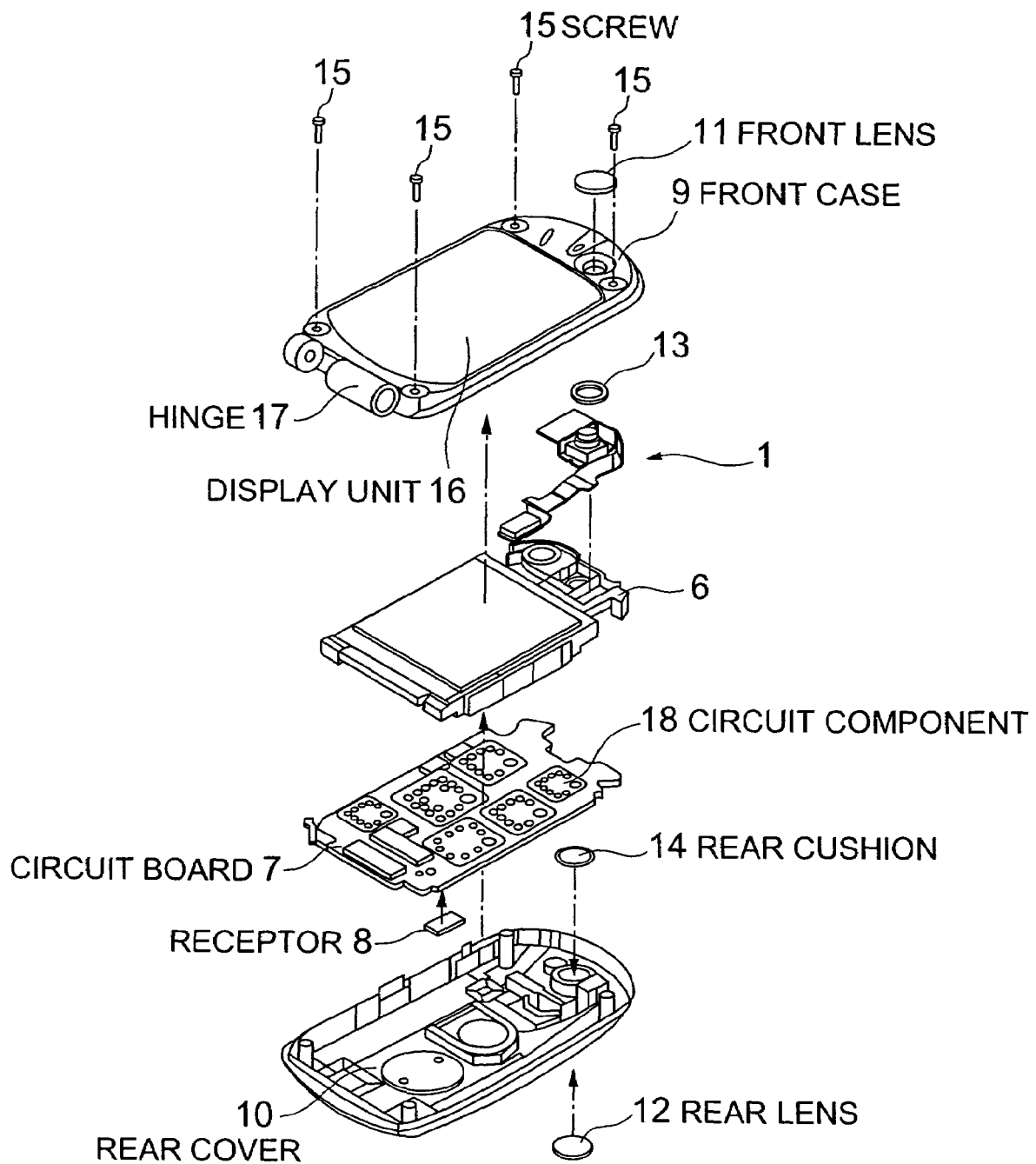
FIG. 7 shows an exploded perspective view of a mobile telephone mounted with the camera module of FIG. 1.

FIG. 7 shows an exploded perspective view of a mobile telephone mounted with the camera module 1 described above. In FIG. 7, the structure of the upper half of a folding mobile telephone, where it has a display unit 16, is depicted, but not the structure of the lower half, where it has operating buttons. Basically, this is a layered structure comprising a front case 9 housing the display unit 16, a rear cover 10, the fixed frame 6 and a circuit board 7, both sandwiched between these front case 9 and rear cover 10.

The camera module 1, being fitted into concaves for camera units provided in the display unit 16 for information displaying and the fixed frame 6 for holding a receiver for voice conveyance, is slid in the direction of the rear cover 10, and a hook of the fixed frame 6 is fitted into a concave of the circuit board 7 to butt against the positioning reference face (not shown) of the front case 9 and thereby to assemble the camera module 1 into the body of the mobile telephone. In that state, the connector 5 mounted on the FPC 4 of the camera module 1 is fitted to the receptor 8 mounted on the other side of the circuit board 7 than the face to which the fixed frame 6 is fixed. Finally, pawls of the rear cover 10 is fitted to concaves of the front case 9, and the front case 9 and the rear cover 10 are fixed with screws 15. In FIG. 7, reference numeral 11 denotes a front lens; 12, a rear lens; 14, a rear cushion; 17, a hinge; and 18, a circuit component.

To describe this embodiment of the invention in further detail with reference to FIG. 1 through FIG. 7, the camera units 2 and 3, both present independently, are mounted in designated positions on the same surface of the FPC 4 made of a soft and flexible material for transmitting control signals from the circuit board 7 as shown in FIG. 1 through FIG. 4. At the same time, the connector 5 for connecting the FPC 4 and the circuit board 7 is also mounted on the same face of the FPC 4 as that on which the camera units are mounted. Next, to make the directions of the fields of view, namely the shooting directions, of the two camera units reverse to each other, the FPC 4 is bent in inverted or normal V shapes in the positions indicated in FIG. 1 by the dotted lines and the one-dot chain line, respectively, in such a way that the lens face of the camera unit 2 and the rear face of the camera unit 3 be on substantially the same plane and the rear face of the camera unit 2 and the lens face of the camera unit 3 be on substantially the same plane.

The camera module 1 of the structure shown in FIG. 3 obtained in this manner is assembled while sliding the lens of the rear camera unit 3 to fit it into a concave round hole in the fixed frame 6. In this process, the connector 5 of the FPC 4 is guided to the rear side with its end leading to the front camera unit 2 being pinched by a protrusion of the fixed frame 6. Then the front face of the circuit board 7 is aligned from the rear face of the fixed frame 6, and a hook, which is a matching pawl of the fixed frame 6, is fitted into a concave provided in a prescribed position of the circuit board 7.

After completion of the assembly of the camera module 1 into the fixed frame 6 and the fitting of the fixed frame 6 and the circuit board 7 to each other, the fitted structure is now assembled into the front case 9. First, as shown in FIG. 7, the front lens 11 is fitted to the front case 9 in the assembled state in the same direction as a protective screen (not shown) for the display unit 16 is, the camera module 1 is fixed to the front camera unit 2, and the front cushion 13 for impact damping is stuck to the inside of the front case 9 in contact with the front camera unit 2.

Next, the fixed frame 6 into which the camera module 1 is assembled into the front case 9 in alignment with a reference. In this process, the front cushion 13 is crushed by a flat part of the front camera unit 2. Also in this process, the connector 5 of the FPC 4 of the camera module 1 is guided to the rear side of the circuit board 7, and fitted to the receptor 8 mounted on a prescribed position of the rear face of the circuit board 7. In this state, the lens of the rear camera unit 3 of the camera module 1 is directed backward, and the extending part (creeping part) of the FPC 4 mounted with the connector 5 is so disposed as not to cross the lens.

Finally, the rear cover 10 is put together by fitting its protrusion into a concave provided for this purpose in the front case 9. Into the rear cover 10, the rear lens 12 of the rear camera unit 3 is fitted in advance via the rear cushion 14 from outside the rear cover.

Since the camera units 2 and 3 are intended to shoot in different directions, the lens face of the front camera unit 2 is exposed on the front case side, and that of the rear camera unit 3 is exposed on the rear cover 10 side. The front camera unit 2 is intended for photographing its user himself or herself, and as such is suitable for short-range shots (its focal distance is adjustable between about 30 cm and 1 m, for instance). The rear camera unit 3 is greater in magnification than the front camera unit 2, and is suitable for long-distance shots (its focal distance is adjustable from 1 m to infinity, for instance).

Figure 8:
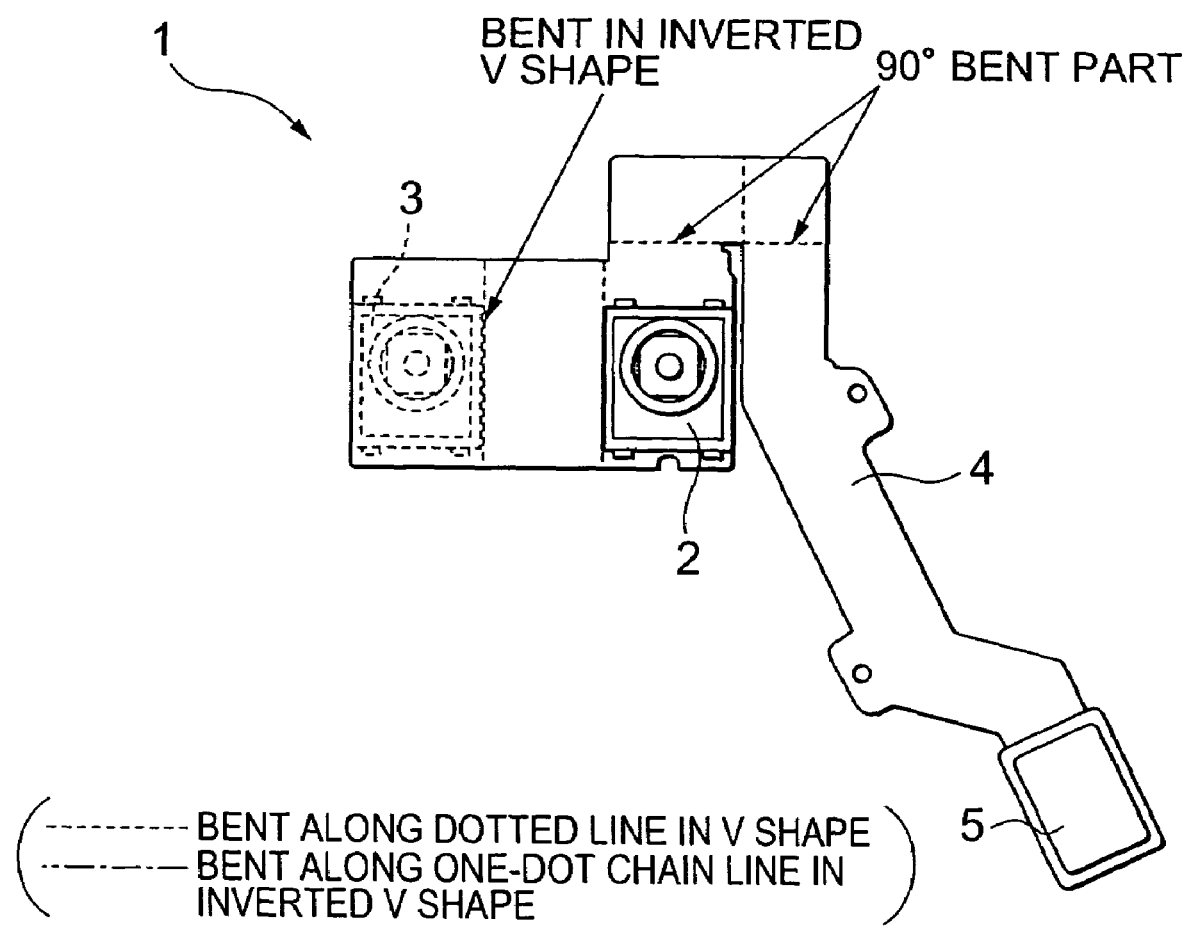
FIG. 8 shows a planar view of a camera module, which is another preferred embodiment of the invention.
Figure 9:
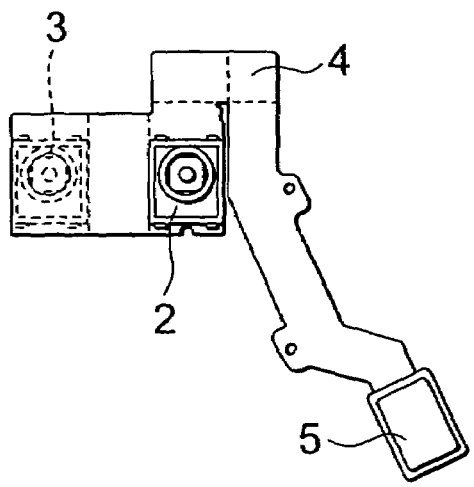
FIG. 9 is a first drawing showing the procedure of assembling the camera module 1 of FIG. 8 into the fixed frame of the body of the mobile communication terminal.
Figure 10:
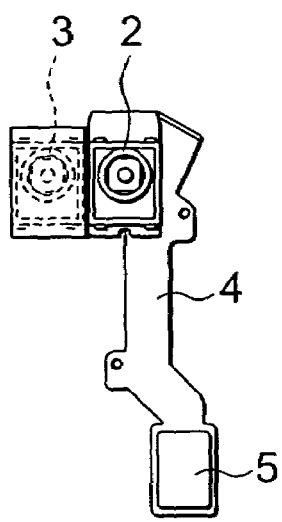
FIG. 10 is a second drawing showing the procedure of assembling the camera module 1 of FIG. 8 into the fixed frame of the body of the mobile communication terminal.

Another preferred embodiment of the present invention will be described with reference to FIG. 8 through FIG. 11. In these drawings, parts having their equivalents in FIG. 1 through FIG. 7 are denoted by the same reference signs as their respective counterparts. FIG. 8 shows a planar view of the camera module 1, and FIG. 10 through FIG. 12, illustrate the procedure of assembling the camera module 1 of FIG. 8 into the fixed frame of the body of the mobile communication terminal.

Referring to FIG. 8, there is provided one FPC 4, and two camera units including the front camera unit 2 and the rear camera unit 3 are mounted on mutually reverse faces of the FPC 4. Over this FPC 4 is printed electrical wiring for controlling the two camera units 2 and 3, which is connected to a receptor on the mobile communication terminal body side via the connector 5 provided at the tip of the FPC 4.

In FIG. 8, positions on the FPC 4 indicated by dotted lines and a one-dot chain line are to be bent to form a normal V shape and an inverted V shape, respectively. The dotted lines which are designated as "90° bent part" indicate that the parts should be bent in a 90-degree V shape. By bending the FPC 4 of this camera module 1 in normal or inverted V shapes according to the dotted lines and the one-dot chain line, respectively, the camera module of the structure shown in FIG. 10 can be obtained. Thus, as shown in FIG. 10, the field of view of the front camera unit 2 will be oriented towards the front face of the drawing, and that of the rear camera unit 3, towards the rear face of the drawing, so that the fields of view of the two units be reverse, or at 180 degrees, to each other and, as in the foregoing embodiment of the invention, the front camera unit 2 can be used for short-range, and the rear camera unit 3, for long-range shots.

Figure 11:
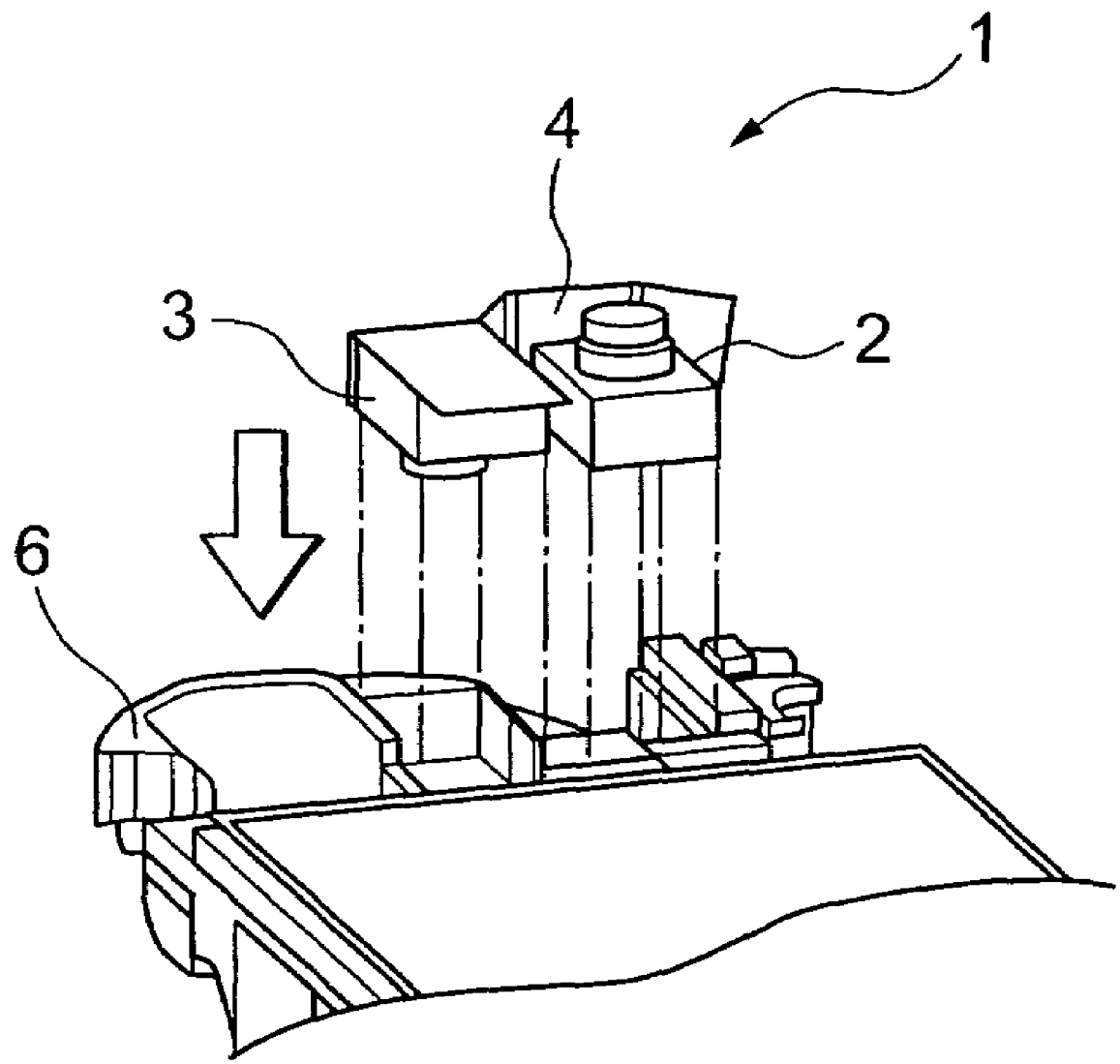
FIG. 11 is a third drawing showing the procedure of assembling the camera module 1 of FIG. 8 into the fixed frame of the body of the mobile communication terminal.

The camera module 1 obtained in this way, as shown in FIG. 11, is fitted to a prescribed position of the fixed frame 6 within the body. The procedure and structure for assembling the module into the body shown in FIG. 6 and FIG. 7 are the same as for this embodiment, and accordingly their description is dispensed with.

This embodiment, too, is so configured that the lens face of the front camera unit 2 and the rear face of the rear camera unit 3 be on substantially the same plane, and the rear face of the front camera unit 2 and the lens face of the rear camera unit 3 be on substantially the same plane. As this configuration makes it possible to accommodate the two camera units within the same height, the freedom of mechanical designing of the mobile communication terminal is correspondingly increased.

As hitherto described, since the present invention makes possible a configuration in which the directions of the fields of view of the two camera units are reverse (180 degrees) to each other by mounting the two camera units on the same FPC and appropriately bending this FPC, there is no need to provide an FPC, which is a printed circuit board for control use, for each camera but one common FPC can suffice, resulting in an advantage of simpler structure.

There is provided another advantage that the user of the camera and a landscape can be simultaneously photographed on the front and rear sides of the body of the mobile communication terminal because the two camera units can be differentiated in optical characteristics if the purpose of use so requires.

There is still another advantage that the thickness directions of the two camera units can be contained within the same height, resulting in a significant alleviation of packaging constraints.

While this invention has been described with reference to certain preferred embodiments thereof, it is to be understood that the subject matter encompassed by this invention is not to be limited to those specific embodiments. Instead, it is intended for the subject matter of the invention to include all alternatives, modifications and equivalents as can be included within the spirit and scope of the following claims.

What is claimed is:

1. A camera module comprising one flexible substrate, first and second camera units mounted on the same face of this flexible substrate, and bent parts so set in prescribed positions of said flexible substrate that the directions of the fields of view of said first and second camera units be reverse to each other and a lens face of said first camera unit and a rear face of said second camera unit are on substantially a same first plane, and a rear face of said first camera unit and a lens face of said second camera unit are on substantially a same second plane different from said first plane.

2. A camera module comprising one flexible substrate, and first and second camera units mounted on different faces of this flexible substrate, and bent parts so set in prescribed positions of said flexible substrate that the directions of the fields of view of said first and second cameras be reverse to each other and a lens face of said first camera unit and a rear face of said second camera unit are on substantially a same first plane, and a rear face of said first camera unit and a lens face of said second camera unit are on substantially a same second plane different from said first plane.

3. A mobile communication terminal having a built-in camera module comprising one flexible substrate, first and second camera units mounted on a same face of said flexible substrate, and bent parts so set in prescribed positions of said flexible substrate that the directions of the fields of view of said first and second camera units be reverse to each other and a lens face of said first camera unit and a rear face of said second camera unit are on substantially a same first plane, and a rear face of said first camera unit and a lens face of said second camera unit are on substantially a same second plane different from said first plane.

4. A mobile communication terminal having a built-in camera module comprising one flexible substrate, and first and second camera units mounted on different faces of said flexible substrate, and bent parts so set in prescribed positions of said flexible substrate that the directions of the fields of view of said first and second cameras be reverse to each other and a lens face of said first camera unit and a rear face of said second camera unit are on substantially a same first plane, and a rear face of said first camera unit and a lens face of said second camera unit are on substantially a same second plane different from said first plane.

5. The mobile communication terminal, as claimed in claim 3, wherein:
said first camera unit is intended for short-range shots and said second camera unit is intended for long-range shots.

6. The mobile communication terminal, as claimed in claim 4, wherein:
said first camera unit is intended for short-range shots and said second camera unit is intended for long-range shots.

7. The mobile communication terminal, as claimed in claim 3, wherein:
said first camera unit is intended for short-range shots and said second camera unit is intended for long-range shots.

8. The mobile communication terminal, as claimed in claim 4, wherein:

said first camera unit is intended for short-range shots and said second camera unit is intended for long-range shots.

9. The mobile communication terminal, as claimed in claim 5, wherein:

the lens face of said first camera unit is exposed on a front case constituting the body of the mobile communication terminal, and the lens face of said second camera unit is exposed on a rear cover constituting said body.

10. The mobile communication terminal, as claimed in claim 6, wherein:

the lens face of said first camera unit is exposed on a front case constituting the body of the mobile communication terminal, and the lens face of said second camera unit is exposed on a rear cover constituting said body.

11. The mobile communication terminal, as claimed in claim 7, wherein:

the lens face of said first camera unit is exposed on a front case constituting the body of the mobile communication terminal, and the lens face of said second camera unit is exposed on a rear cover constituting said body.

12. The mobile communication terminal, as claimed in claim 8, wherein:

the lens face of said first camera unit is exposed on a front case constituting the body of the mobile communication terminal, and the lens face of said second camera unit is exposed on a rear cover constituting said body.

* * * * *